United States Patent
Kang

(10) Patent No.: US 7,692,374 B2
(45) Date of Patent: Apr. 6, 2010

(54) ORGANIC LIGHT EMITTING DISPLAY DEVICE WITH MULTI-LAYERED ELECTRODE AND METHOD OF USING THE SAME

(75) Inventor: Tae-Wook Kang, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 743 days.

(21) Appl. No.: 11/385,097

(22) Filed: Mar. 20, 2006

(65) Prior Publication Data
US 2006/0208632 A1   Sep. 21, 2006

(30) Foreign Application Priority Data
Mar. 21, 2005   (KR) .................. 10-2005-0023375

(51) Int. Cl.
H01J 1/62       (2006.01)
H01J 63/04      (2006.01)

(52) U.S. Cl. .................. 313/504; 313/498; 313/506; 313/512

(58) Field of Classification Search .......... 313/498–512
See application file for complete search history.

(56) References Cited

U.S. PATENT DOCUMENTS 5,686,360 A * 11/1997 Harvey et al. ............. 438/28
5,811,177 A * 9/1998 Shi et al. .................. 428/209
6,960,877 B1 * 11/2005 Heeks et al. ............... 313/512
2005/0249974 A1 * 11/2005 Mori et al. ................ 428/690
2005/0260337 A1 * 11/2005 Ogura et al. ................ 427/66
2006/0093852 A1 * 5/2006 Marsitzky et al. .......... 428/690

FOREIGN PATENT DOCUMENTS

KR   10-2006-0040426 A   5/2006

OTHER PUBLICATIONS

Korean Office Action issued Feb. 26, 2007 in Korean Patent Application No. 10-2005-0023375.

* cited by examiner

*Primary Examiner*—Karabi Guharay
*Assistant Examiner*—Kevin Quarterman
(74) *Attorney, Agent, or Firm*—Knobbe Martens Olson & Bear LLP

(57) ABSTRACT

An organic light emitting diode and a method of manufacturing the same are provided. The organic light emitting diode includes: a first electrode disposed on a substrate; an organic layer including at least an emitting layer disposed on the first electrode; and a second electrode including at least two layers and a Ca thin layer interposed between the at least two layers on the organic layer. In this case, the Ca layer acts as a moisture-absorbing material for preventing moisture and oxygen from penetrating, so that pixel shrinkage and dark spot defects due to the penetration may be prevented, thereby providing an organic light emitting diode and a method of manufacturing the same without using any moisture absorbing material at the time of encapsulation.

18 Claims, 4 Drawing Sheets

ORGANIC LIGHT EMITTING DISPLAY DEVICE WITH MULTI-LAYERED ELECTRODE AND METHOD OF USING THE SAME

CROSS-REFERENCE TO RELATED APPLICATIONS

This application claims priority to and the benefit of Korean Patent Application No. 2005-23375, filed on Mar. 21, 2005 in the Korean Intellectual Property Office, the disclosure of which is incorporated by reference in its entirety.

BACKGROUND OF THE INVENTION

1. Field of the Invention

The present invention relates to an organic light emitting diode, and more particularly, to an electrode with a moisture-absorbing material.

2. Description of the Related Technology

Typically, an organic light emitting display, among flat panel displays, is not easily affected by impact or vibration, and has a wide temperature usage range, a wide viewing angle, and a fast response speed to provide a clear moving picture compared to other flat panel displays, so that it has attracted attention as a next generation flat panel display.

Such an organic light emitting display may be classified into a passive matrix type and an active matrix type. The passive matrix type requires a drive source located outside the display area while the active matrix type has thin film transistors (TFT) located in the display area as switching elements.

In an active matrix organic light emitting display, each pixel is driven by a TFT as a switching element so that a voltage supplied to each pixel can be completely independent from each other and may be persistent. Thus, the active matrix organic light emitting display has many advantages such as high resolution, high image quality, large area implementation and so forth.

Additionally, the organic light emitting display may be classified as a bottom emission configuration and a top emission configuration. In the bottom emission configuration, light is emitted through the substrate, on which the display device is built. On the other hand, in the top emission configuration, light is emitted in a direction away from the substrate. In some configurations, the organic light emitting display may emit light in directions through and away from the substrate.

FIG. 1 is a cross-sectional view of an exemplary bottom-emission organic light emitting diode, which forms a pixel or subpixel of the organic light emitting display. In the organic light emitting diode, a first or transparent electrode 110 is formed on a substrate 100. The first electrode 110 may be formed of a transparent material such as indium tin oxide (ITO), indium zinc oxide (IZO), and $In_2O_3$.

Subsequently, an organic layer 120 is formed on the first electrode 110. The organic layer contains a light emitting material. In addition to the light emitting layer, the organic layer may include at least one of an electron injection layer, an electron transport layer, a hole injection layer, a hole transport layer, and a hole block layer.

Subsequently, a second or reflective electrode 130 is formed on the organic layer 120 to complete the formation of the organic light emitting diode. The second electrode 130 may be formed of a reflective material such as Ca, Mg, MgAg, Ag, an Ag alloy, Al, and an Al alloy.

Next, the drive source is included in the organic light emitting diode and then an encapsulation process is carried out to finish an organic light emitting display.

In the above-described organic light emitting display, Al or Al alloy is typically employed in a single layer for the second or reflective electrode. Without an extra desiccant or getter, however, Al or Al alloy has insufficient resistance against the penetration of moisture ($H_2O$) and/or oxygen ($O_2$), and thus pixel shrinkage or dark spot defects may easily occur unless a moisture absorbing material is used an encapsulation substrate in the encapsulation process. The foregoing discussion is to provide description of related technology and does not constitute an admission of prior art.

SUMMARY OF CERTAIN INVENTIVE ASPECTS

One aspect of the invention provides an organic light emitting display device. The device comprises: a substrate; and an array of display pixels comprising a first pixel, which comprises: a first electrode over the substrate, an organic light emitting layer over the first electrode, and a second electrode over the organic light emitting layer, the second electrode comprising a first layer and a second layer, the first layer being located between the light emitting layer and the second layer, the first layer comprising calcium.

In the device, each pixel in the array of display pixels may comprise the same structure as the first pixel. The first layer may further comprise one or more selected from the group consisting of Al, $Al_2O_3$, Al alloys, Mg, MgAg, Ag, and Ag alloys. The second layer may comprise one or more selected from the group consisting of Al, $Al_2O_3$, Al alloys, Mg, MgAg, Ag, and Ag alloys. The second electrode may be substantially transparent. The second electrode may further comprise at least one of an ITO layer and an Ag layer. Alternatively, the second electrode may be substantially reflective.

The second electrode may further comprise a third layer between the first layer and the organic light emitting layer. The third layer may comprise one or more selected from the group consisting of Al, $Al_2O_3$, Al alloys, Mg, MgAg, Ag, and Ag alloys. The second electrode may further comprise a fourth layer between the third layer and the organic light emitting layer, and the fourth layer may comprise calcium.

The second electrode may further comprise a fifth layer between the fourth layer and the organic light emitting layer. The fifth layer may comprise one or more selected from the group consisting of Al, $Al_2O_3$, Al alloys, Mg, MgAg, Ag, and Ag alloys. The second electrode may further comprise a fourth layer between the third layer and the organic light emitting layer, and the fourth layer may comprise one or more selected from the group consisting of Al, $Al_2O_3$, Al alloys, Mg, MgAg, Ag, and Ag alloys. The second electrode may further comprise a fifth layer over the second layer, and the fifth layer may comprise one or more selected from the group consisting of Al, $Al_2O_3$, Al alloys, Mg, MgAg, Ag, and Ag alloys.

The second electrode may comprise an Al/Ca/Al layer structure. The second electrode may comprise an Al/Ca/Al/Ca/Al layer structure. The second electrode may comprise a $Al/Al_2O_3/Ca/Al/Al_2O_3$ layer structure.

The device may further comprise at least one selected from the group consisting of an electron injection layer, an electron transport layer, a hole injection layer, a hole transport layer, and a hole blocking layer between the first and second electrodes. The device may further comprise an encapsulation member 202, wherein the encapsulation member 202 is bonded to the substrate 200, and substantially hermetically encloses the array of display pixels 204 and a space 206 around the array, wherein the space 206 is substantially free of a desiccant (see FIG. 4).

Another aspect of the invention provides a method of using an organic light emitting device. The method comprises: providing an organic light emitting device comprising a first electrode over a substrate, a second electrode over the first electrode, and an organic light emitting layer interposed between the first and second electrodes, the second electrode comprising a first layer over the organic light emitting layer and a second layer over the first layer, the first layer comprising calcium; and absorbing at least one of water and oxygen in the first layer.

In the method, the second electrode may further comprise a third layer interposed between the first layer and the organic light emitting layer, and the second electrode may comprises an Al/Ca/Al layer structure.

Yet another aspect of the invention provides an organic light emitting diode and a method of manufacturing the same, which has a second electrode composed of at least two layers and a Ca layer interposed between the two layers, so that pixel shrinkage and dark spot defects may be prevented without using a moisture absorbing material for an encapsulation substrate.

The organic light emitting diode may include a first electrode disposed on a substrate; an organic layer including at least an emitting layer disposed on the first electrode; and a second electrode including at least two layers and a Ca thin layer interposed between the at least two layers on the organic layer.

Another aspect of the invention provides a method of manufacturing an organic light emitting diode. The method includes: forming a first electrode on a substrate; forming an organic layer including at least an emitting layer on the first electrode; and forming a second electrode including at least two layers and a Ca thin layer interposed between the two layers on the organic layer.

BRIEF DESCRIPTION OF THE DRAWINGS

The above and other features of the present invention will be described in terms of certain exemplary embodiments thereof with reference to the attached drawings.

DETAILED DESCRIPTION OF CERTAIN INVENTIVE EMBODIMENTS

Figure 1:
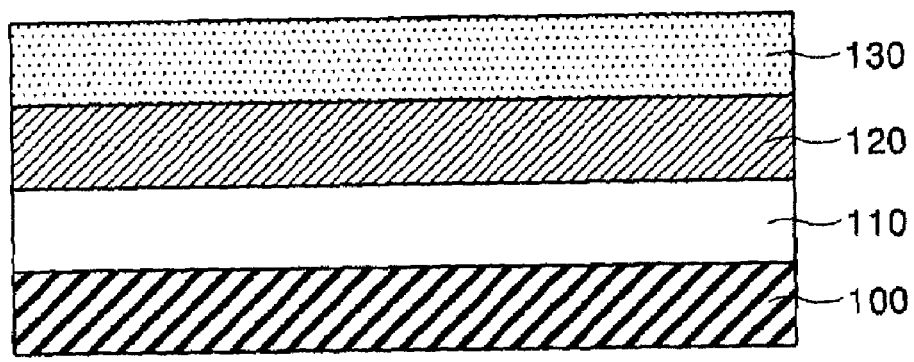
FIG. 1 is a cross-sectional view of an exemplary configuration organic light emitting diode that can be benefited with the features of the invention.

The invention will now be described more fully hereinafter with reference to the accompanying drawings, in which embodiments of the invention are shown. This invention, however, may be embodied in different forms and should not be construed as limited to the embodiments set forth herein. Rather, these embodiments are provided so that this disclosure will be thorough and complete, and will fully convey the scope of the invention to those skilled in the art. Like reference numerals designate like elements throughout the specification.

Figure 2A:
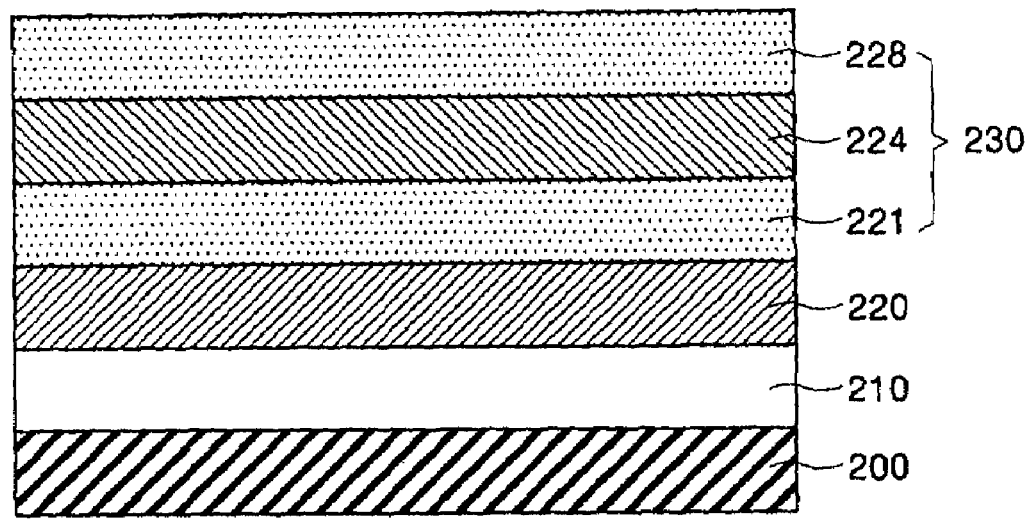
FIGS. 2A to 2C are cross-sectional views of an organic light emitting diode in accordance with embodiments of the invention.

FIG. 2A is a cross-sectional view of an organic light emitting diode in accordance with a first embodiment of the invention. Referring to FIG. 2A, the organic light emitting diode includes a first electrode 210, an organic layer 220, and a second electrode 230. The second electrode 230 has a triple layer structure having two layers and a calcium (Ca) layer interposed between the two layers. In other embodiments, the second electrode 230 may have one or more layers in addition to the three layers described above.

The first electrode 210 is formed on the entire surface of a substrate 200 which is formed of glass, crystal, plastic, or metal. In the illustrated embodiment, the substrate 200 is a transparent substrate. The first electrode 210 is an anode electrode formed of a transparent material selected from ITO, IZO, and $In_2O_3$.

Figure 3:
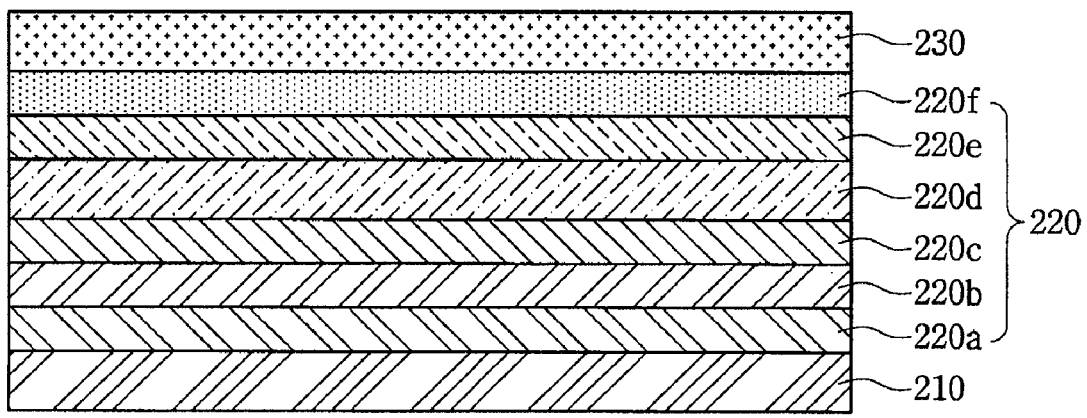
FIG. 3 is a cross-sectional view of an organic light emitting diode in accordance with embodiments of the invention.
Figure 4:
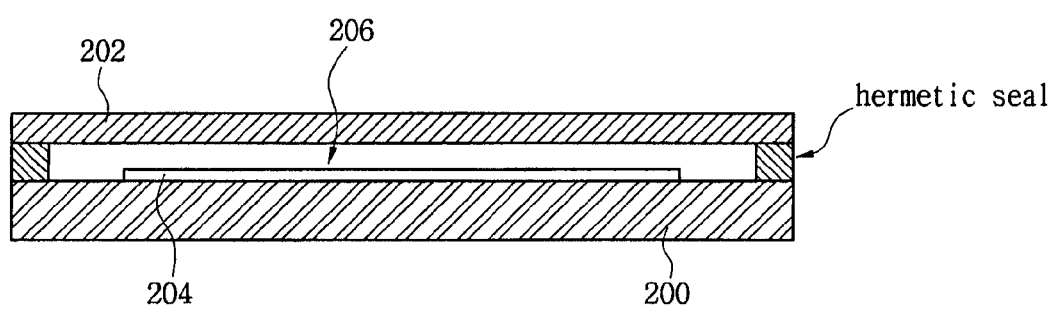
FIG. 4 is a cross-sectional view of an organic light emitting display device in accordance with embodiments of the invention.

The organic layer 220 is formed on the first electrode 210. In this case, referring to FIG. 3, the organic layer 220 constitutes or includes a light emitting layer (EL) 220c using excitons generated by recombination of holes and electrons injected into the organic layer. The organic layer 220 may further include several sub-layers according to their functions. The organic layer 220 may include at least one of a hole injection layer (HIL) 220a facilitating emission of holes, a hole transport layer (HTL) 220b transporting the holes injected from the hole injection layer to the emitting layer, a hole blocking layer 220d, an electron injection layer (EIL) 220f facilitating emission of electrons, and an electron transport layer (ETL) 220e transporting the electrons injected from the electron injection layer to the emitting layer 220c to form multiple layers. In embodiments, the organic layer 220 or its sublayers may employ a low molecular compound and/or a high molecular compound. The organic layer may be formed by any suitable methods, including, but not limited to, spin coating, evaporation, and laser induced thermal imaging (LITI).

The second electrode 230 is formed on the organic layer 220. The illustrated second electrode 230 includes a lower reflective layer 221, an upper reflective layer 228, and a Ca layer 224 interposed between the two reflective electrodes. In the illustrated embodiment, the second electrode 230 serves as a cathode electrode. The lower reflective layer 221 is formed over the organic layer 220. The lower reflective layer 221 may be formed of Al or Al alloy. The Ca layer 224 is formed over the lower reflective layer 221. The Ca layer 224 functions to remove or absorb moisture $H_2O$ and/or oxygen $O_2$ entering into the laminated structure, most likely through the upper reflective layer 228. The upper reflective electrode 228 is formed on the Ca layer 224.

In the illustrated embodiment, because the Ca layer can absorb moisture, the organic light emitting diode may be encapsulated with an encapsulation substrate without having a moisture absorbing material or a desiccant. However, in some embodiments, to further prevent water or oxygen from entering into the organic light emitting diode, one or more materials absorbing moisture and/or oxygen may be formed on or in an appropriate location within the organic light emitting display device including the organic light emitting diode. The skilled artisan will appreciate the appropriate locations for such a material within the device.

Although not shown, the organic light emitting display may further include a thin film transistor having a semiconductor layer, a gate electrode, and source and drain electrodes between the substrate and the organic light emitting diode. In certain embodiments for top-emission type devices, the second electrode may be substantially transparent, and may have an Al/ITO/Ag structure or any other transparent structures. These additional structures also apply to embodiments described below.

Figure 2B:
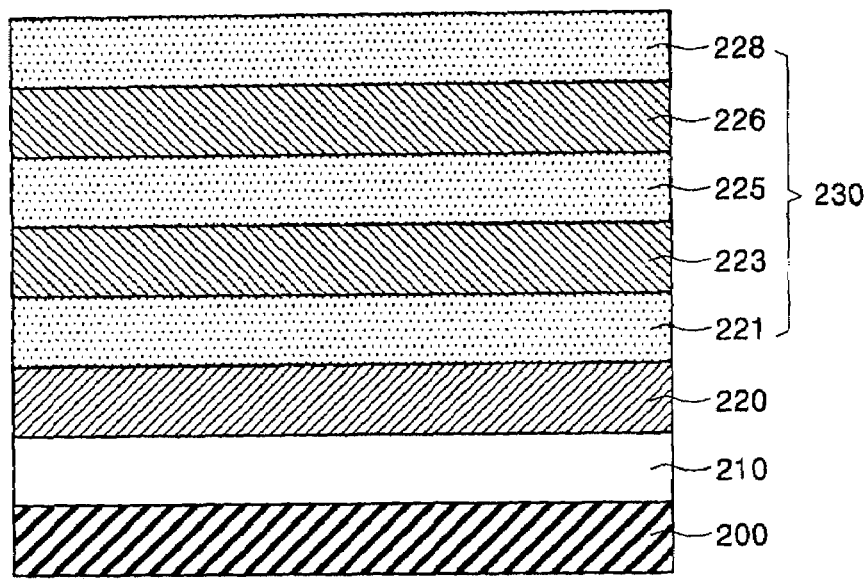

FIG. 2B is a cross-sectional view of an organic light emitting diode in accordance with a second embodiment. Referring to FIG. 2B, the organic light emitting diode includes a first electrode 210 on a substrate 200, an organic layer 220 overlying the first electrode 210, and a second electrode 230 overlying the organic layer 220. The illustrated second electrode 230 has five layers. In one embodiment, three of the layers are formed of the same material although not limited thereto, and two of the five layers contain Ca. Each of the two Ca layers is interposed between respective two of the three layers.

The organic light emitting diode of the second embodiment is the same as that of the first embodiment except the structure of the second electrode, and thus its description will be omitted.

The second electrode 230 includes a lower reflective layer 221, a lower Ca layer 223, an intermediate reflective layer 225, an upper Ca layer 226, and an upper reflective layer 228. The lower reflective layer 221 is formed on the organic layer 220. The lower Ca layer 223 is formed on the lower reflective layer 221. Then, the intermediate reflective layer 225 is formed on the lower Ca layer 223. The upper Ca layer 226 is formed on the intermediate reflective layer 224. Next, the upper reflective layer 228 is formed as a top layer on the upper Ca layer 226. Accordingly, the organic light emitting diode has the second electrode 230 including at least one Ca layer.

In the organic light emitting diode including the second electrode having the above-described structure, because the second electrode has two Ca layers rather than one as in the first embodiment, the ability of removing moisture ($H_2O$) and oxygen ($O_2$) may be further enhanced, and the pixel shrinkage and dart spot defects may be more effectively prevented.

Figure 2C:
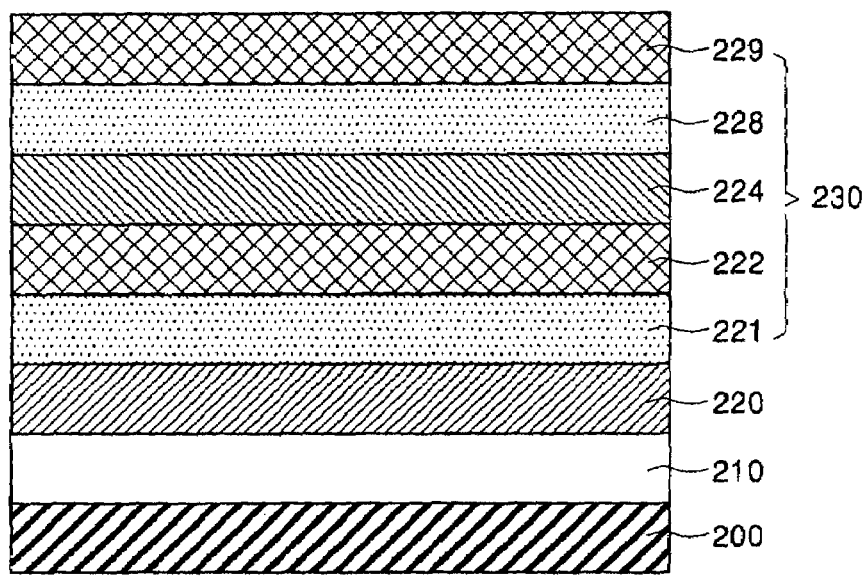

In addition, FIG. 2C is a cross-sectional view of an organic light emitting diode including a second electrode having an Al oxide layer and a Ca layer in accordance with a third embodiment of the invention. Referring to FIG. 2C, the organic light emitting diode includes a first electrode 210, an organic layer 220, and a second electrode having a plurality of Al or Al alloy layers, an Al oxide layer and a Ca layer.

The first electrode 210 is formed on a substrate 200. The organic layer 220 is formed on the first electrode 210. A lower reflective layer 221 is formed on the organic layer 220. In addition, a lower reflective oxide layer 222 is formed of $Al_2O_3$ on the lower reflective layer 221 by a plasma enhanced chemical vapor deposition (PECVD) method. The PECVD may be carried out on a surface of the lower reflective layer 221 at an atmosphere of moisture ($H_2O$), oxygen ($O_2$), and ozone ($O_3$). A Ca layer 224 is formed on the reflective oxide layer 222. An upper reflective layer 228 is formed on the Ca layer 224. An upper reflective oxide layer 229 is formed of $Al_2O_3$ on the upper reflective layer 228 using the same PECVD method used in forming the lower reflective oxide layer 222.

The organic light emitting diode described above uses the upper Al reflective layer and the upper Al oxide layer overlying the upper Al reflective layer. Because the Al oxide layer has excellent chemical stability, penetration of $H_2O$ and $O_2$ may be primarily prevented by the Al oxide layer. In addition, the Ca layer and the lower Al oxide layer absorb $H_2O$ and/or $O_2$ if $H_2O$ and/or $O_2$ enter into the laminated structure at all. The Ca layer which has excellent chemical reaction with $H_2O$ and $O_2$ can block $H_2O$ and $O_2$, if any. As a result, water and oxygen penetration toward the lower layers can effectively be prevented.

In addition, the upper Al reflective layer and the upper Al oxide layer reduces the amount of $H_2O$ and $O_2$ penetrating from the outside into the Ca layer and thus increases the lifetime of the Ca layer increases. Accordingly, the lifetime of the organic light emitting diode can also increase. In addition, the reflective electrode has multiple layers having different refractive indexes and thus the organic light emitting diode may have improved visibility and contrast.

In one embodiment, a seal may be partially used as an encapsulation material at the time of encapsulation in the above-described three embodiments. In another embodiment, a seal may be used on the entire surface to protect the layer overlying the second electrode from $H_2O$ and $O_2$, to enhance the lifetime of the internal Ca layer, and to increase the lifetime of the organic electroluminescent device.

In the illustrated embodiments, the Ca layer within the second electrode absorbs $H_2O$ and $O_2$ to serve as a moisture absorbing material at the time of manufacturing or driving the organic light emitting diode. This configuration prevents pixel shrinkage and dark spot defects from occurring due to water and oxygen with or without including the moisture absorbing material to the encapsulation substrate at the time of encapsulation.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display device, comprising:
 a substrate; and
 an array of display pixels comprising a first pixel, which comprises:
  a first electrode over the substrate,
  at least one organic layer over the first electrode, the at least one organic layer comprising an organic light emitting layer, and
  a second electrode over the at least one organic layer, the second electrode comprising a first layer, a second layer, and a third layer,
  wherein the third layer is located between the at least one organic layer and the first layer, and contacts the at least one organic layer, the third layer being reflective,
  wherein the first layer is located between the third layer and the second layer, the first layer comprising calcium.

2. The device of claim 1, wherein each pixel in the array of display pixels comprises the same structure as the first pixel.

3. The device of claim 1, wherein the third layer comprises one or more selected from the group consisting of Al, $Al_2O_3$, Al alloys, Mg, MgAg, Ag, and Ag alloys.

4. The device of claim 1, wherein the second layer comprises one or more selected from the group consisting of Al, $Al_2O_3$, Al alloys, Mg, MgAg, Ag, and Ag alloys.

5. The device of claim 1, wherein the second electrode is substantially reflective.

6. The device of claim 1, wherein the second electrode further comprises a fourth layer between the third layer and the first layer, and wherein the fourth layer comprises calcium.

7. The device of claim 6, wherein the second electrode further comprises a fifth layer between the fourth layer and the first layer, and wherein the fifth layer comprises one or more selected from the group consisting of Al, $Al_2O_3$, Al alloys, Mg, MgAg, Ag, and Ag alloys.

8. The device of claim 1, wherein the second electrode further comprises a fourth layer between the third layer and the first layer, and wherein the fourth layer comprises one or more selected from the group consisting of Al, $Al_2O_3$, Al alloys, Mg, MgAg, Ag, and Ag alloys.

9. The device of claim 8, wherein the second electrode further comprises a fifth layer over the second layer, and wherein the fifth layer comprises one or more selected from the group consisting of Al, $Al_2O_3$, Al alloys, Mg, MgAg, Ag, and Ag alloys.

10. The device of claim 1, wherein the second electrode comprises an Al/Ca/Al layer structure.

11. The device of claim 1, wherein the second electrode comprises an Al/Ca/Al/Ca/Al layer structure.

12. The device of claim 1, wherein the second electrode comprises an Al/$Al_2O_3$/Ca/Al/$Al_2O_3$ layer structure.

13. The device of claim 1, further comprising at least one selected from the group consisting of an electron injection layer, an electron transport layer, a hole injection layer, a hole transport layer, and a hole blocking layer between the first and second electrodes.

14. The device of claim 1, further comprising an encapsulation member, wherein the encapsulation member is bonded to the substrate, substantially hermetically enclosing the array of display pixels and a space around the array, wherein the space is substantially free of a desiccant.

15. A method of using an organic light emitting device, comprising:
providing an organic light emitting device comprising a first electrode over a substrate, a second electrode over the first electrode, and at least one organic layer interposed between the first and second electrodes, the at least one organic layer comprising an organic light emitting layer, the second electrode comprising a first layer over the at least one organic layer, a second layer over the first layer, and a third layer between the at least one organic layer and the first layer, the first layer comprising calcium, wherein the third layer contacts the at least one organic layer, and is reflective; and
absorbing at least one of water and oxygen in the first layer.

16. The method of claim 15, wherein the second electrode further comprises a third layer interposed between the first layer and the organic light emitting layer, wherein the second electrode comprises an Al/Ca/Al layer structure.

17. An organic light emitting display device, comprising:
a substrate; and
an array of display pixels comprising a first pixel, which comprises:
a first electrode over the substrate,
an organic light emitting layer over the first electrode, and
a second electrode over the organic light emitting layer, the second electrode comprising a first layer and a second layer, the first layer being located between the light emitting layer and the second layer, the first layer comprising calcium, wherein the second electrode is substantially transparent.

18. The device of claim 17, wherein the second electrode further comprises at least one of an ITO layer and an Ag layer.

* * * * *